United States Patent
Holz et al.

(10) Patent No.: US 9,991,428 B2
(45) Date of Patent: Jun. 5, 2018

(54) OPTOELECTRONIC COMPONENT AND METHOD FOR THE PRODUCTION THEREOF

(71) Applicant: OSRAM Opto Semiconductors GmbH, Regensburg (DE)

(72) Inventors: Juergen Holz, Wenzenbach (DE); Michael Zitzlsperger, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 13 days.

(21) Appl. No.: 14/889,653

(22) PCT Filed: May 17, 2013

(86) PCT No.: PCT/EP2013/060279
§ 371 (c)(1),
(2) Date: Nov. 6, 2015

(87) PCT Pub. No.: WO2014/183800
PCT Pub. Date: Nov. 20, 2014

(65) Prior Publication Data
US 2016/0118553 A1    Apr. 28, 2016

(51) Int. Cl.
*H01L 33/54* (2010.01)
*H01L 33/50* (2010.01)
(Continued)

(52) U.S. Cl.
CPC ............ *H01L 33/54* (2013.01); *H01L 33/486* (2013.01); *H01L 33/505* (2013.01);
(Continued)

(58) Field of Classification Search
None
See application file for complete search history.

(56) References Cited

U.S. PATENT DOCUMENTS

| | | |
|---|---|---|
| 2006/0103302 A1 | 5/2006 | Tanaka et al. |
| 2008/0044934 A1 | 2/2008 | Loh et al. |

(Continued)

FOREIGN PATENT DOCUMENTS

| | | |
|---|---|---|
| DE | 10 2005 053217 A1 | 6/2006 |
| DE | 10 2007 039 230 A1 | 3/2008 |

(Continued)

OTHER PUBLICATIONS

Notification of Reasons for Refusal dated Nov. 28, 2016, of corresponding Japanese Application No. 2016-513237 in English.

(Continued)

*Primary Examiner* — Su C Kim
*Assistant Examiner* — David S Wilbert
(74) *Attorney, Agent, or Firm* — DLA Piper LLP (US)

(57) ABSTRACT

An optoelectronic component includes a housing having a first cavity open toward an upper side of the housing, and a second cavity open toward the upper side of the housing, wherein the first cavity and the second cavity connect by a connecting channel, an optoelectronic semiconductor chip is arranged in the first cavity, a potting material is arranged in a region of the first cavity enclosing the optoelectronic semiconductor chip, a bond wire is arranged between an electrical contact surface of the optoelectronic semiconductor chip and a bond surface of the housing, and the bond surface is arranged in the connecting channel.

15 Claims, 10 Drawing Sheets

(51) Int. Cl.
*H01L 33/48* (2010.01)
*H01L 25/075* (2006.01)
*H01L 33/62* (2010.01)

(52) U.S. Cl.
CPC .......... *H01L 25/0753* (2013.01); *H01L 33/62* (2013.01); *H01L 2224/05554* (2013.01); *H01L 2224/48247* (2013.01); *H01L 2224/48471* (2013.01); *H01L 2933/005* (2013.01); *H01L 2933/0033* (2013.01); *H01L 2933/0091* (2013.01)

(56) References Cited

U.S. PATENT DOCUMENTS

| | | | | |
|---|---|---|---|---|
| 2009/0224271 | A1* | 9/2009 | Seo | H01L 33/483 257/98 |
| 2011/0042690 | A1* | 2/2011 | Lee | H01L 24/48 257/88 |
| 2011/0141716 | A1 | 6/2011 | Wiesmann et al. | |
| 2011/0241028 | A1* | 10/2011 | Park | H01L 33/486 257/88 |
| 2012/0223343 | A1* | 9/2012 | Kang | H01L 25/0753 257/88 |
| 2014/0103798 | A1 | 4/2014 | Yamanaka et al. | |

FOREIGN PATENT DOCUMENTS

| | | |
|---|---|---|
| DE | 10 2010 023 955 A1 | 12/2011 |
| DE | 10 2010 024 864 A1 | 12/2011 |
| DE | 10 2010 045 596 A1 | 3/2012 |
| EP | 2 234 165 A2 | 9/2010 |
| JP | 07-038154 | 2/1995 |
| JP | 07038154 A * | 2/1995 |
| JP | 2011-40762 | 2/2011 |
| JP | 2011-511445 | 6/2011 |
| KR | 2012 0091862 A | 8/2012 |
| TW | 201036504 | 10/2010 |
| WO | 2013/001687 | 1/2013 |

OTHER PUBLICATIONS

English translation of the Notification for the Opinion of Examination dated Mar. 9, 2016 of corresponding Taiwanese Application No. 103117124.

* cited by examiner

… (US 9,991,428 B2)

OPTOELECTRONIC COMPONENT AND METHOD FOR THE PRODUCTION THEREOF

TECHNICAL FIELD

This disclosure relates to an optoelectronic component and a method of producing an optoelectronic component.

BACKGROUND

Optoelectronic components are known in which an optoelectronic semiconductor chip is arranged in a cavity, which is open toward an emission side of the optoelectronic component, of a housing of the optoelectronic component. The optoelectronic semiconductor chip and possible bond wires and converter elements are frequently potted using a clear or pigmented potting material which at least partially fills up the cavity. The potting material can form an optical reflector and can be used for mechanical protection of the chip and the bond wires and converter elements.

One difficulty in the introduction of the potting material into the cavities of conventional optoelectronic components is ensuring reliable covering of the bond wires with potting material and simultaneously preventing contamination of an upper side of the optoelectronic semiconductor chip or the converter element or another radiation-emitting surface with potting material.

It could therefore be helpful to provide an optoelectronic component and a method of producing an optoelectronic component.

SUMMARY

We provide an optoelectronic component including a housing having a first cavity open toward an upper side of the housing, and a second cavity open toward the upper side of the housing, wherein the first cavity and the second cavity connect by a connecting channel, an optoelectronic semiconductor chip is arranged in the first cavity, a potting material is arranged in a region of the first cavity enclosing the optoelectronic semiconductor chip, a bond wire is arranged between an electrical contact surface of the optoelectronic semiconductor chip and a bond surface of the housing, and the bond surface is arranged in the connecting channel.

We also provide an optoelectronic component including a housing having a first cavity open toward an upper side of the housing, and a second cavity open toward the upper side of the housing, wherein the first cavity and the second cavity connect by a connecting channel, an optoelectronic semiconductor chip is arranged in the first cavity, a potting material is arranged in a region of the first cavity enclosing the optoelectronic semiconductor chip, a bond wire is arranged between an electrical contact surface of the optoelectronic semiconductor chip and a bond surface of the housing, the optoelectronic semiconductor chip has an upper side having a first geometric shape, the first cavity has a bottom surface having a geometric basic shape formed by stretching from the first geometric shape, the bottom surface of the first cavity additionally has a bulge in relation to the geometric basic shape, and the bond surface is arranged in the bulge on the bottom surface.

We further provide a method of producing an optoelectronic component including providing a housing having a first cavity open toward an upper side of the housing, and a second cavity open toward the upper side of the housing, wherein the first cavity and the second cavity connect by a connecting channel, arranging an optoelectronic semiconductor chip in the first cavity, and introducing a potting material into a region of the first cavity enclosing the optoelectronic semiconductor chip, wherein the potting material is introduced into the second cavity, and the potting material reaches the first cavity from the second cavity through the connecting channel.

LIST OF REFERENCE NUMERALS

Figure 1:
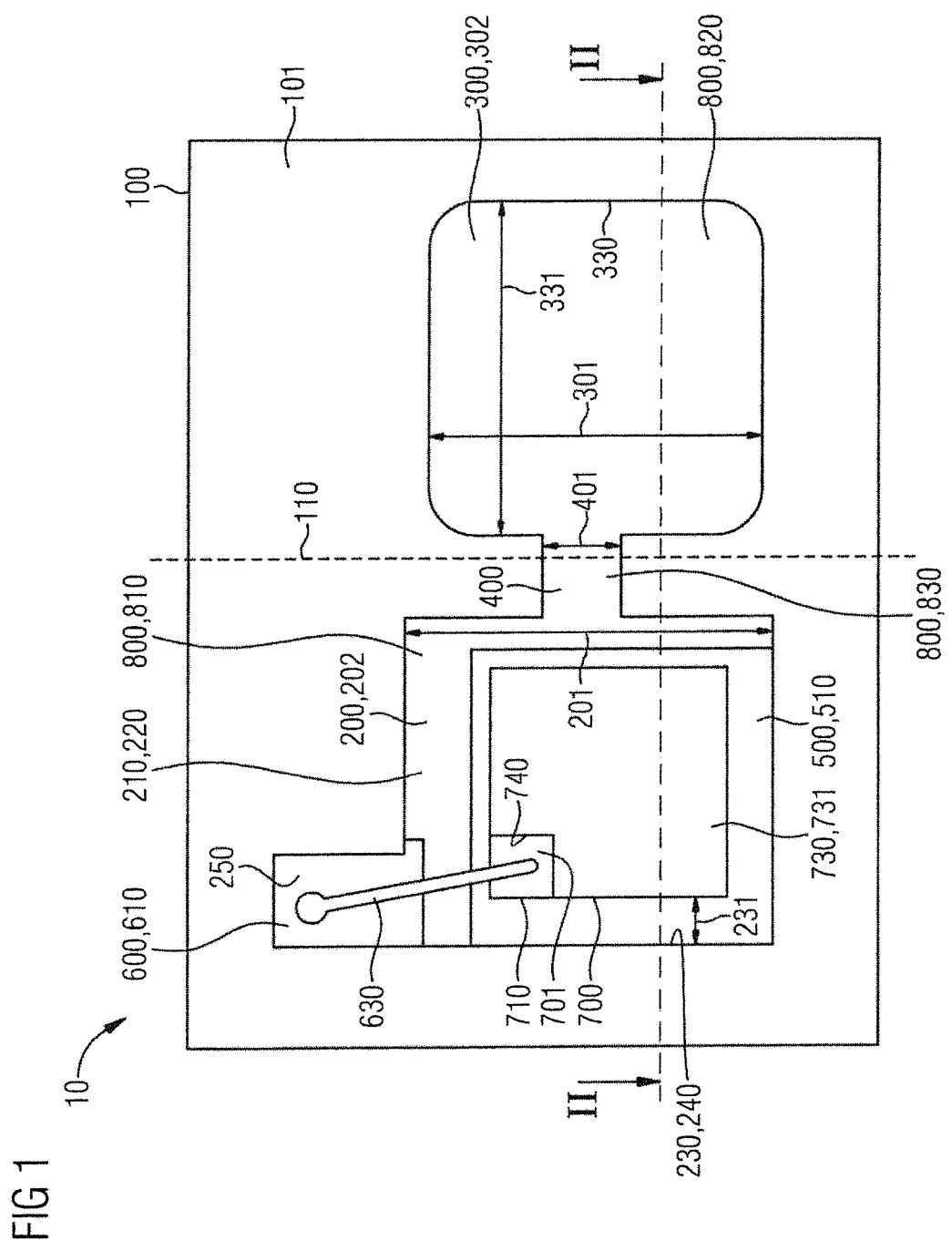
FIG. 1 shows a top view of a first optoelectronic component.

10 first optoelectronic component
11 perpendicular direction
20 second optoelectronic component
30 third optoelectronic component
40 fourth optoelectronic component
50 fifth optoelectronic component
60 sixth optoelectronic component
70 seventh optoelectronic component
80 eighth optoelectronic component
85 component composite
100 housing
101 upper side
110 partition plane
200 first cavity
201 width
202 first volume
210 bottom surface
220 opening area
230 circumferential wall
231 spacing
240 edge
250 bulge
260 step
300 second cavity
301 width
302 second volume
330 circumferential wall
331 wall spacing
400 connecting channel
401 width
500 first conductor frame section
510 chip receptacle surface
520 first solder contact surface 600 second conductor frame section
610 bond surface
620 second solder contact surface
630 bond wire
700 optoelectronic semiconductor chip
701 upper side
702 lower side
710 upper electrical contact surface
720 lower electrical contact surface
730 wavelength-converting element
731 upper side
740 opening
800 potting material
810 first part
811 first height
812 first meniscus
820 second part
821 second height
822 second meniscus
830 third part
840 further part
1250 further bulge
1300 further second cavity
1400 further connecting channel
1500 further first conductor frame section
1600 further second conductor frame section
1630 further bond wire
1700 further optoelectronic semiconductor chip

DETAILED DESCRIPTION

Our optoelectronic component comprises a housing having a first cavity open toward an upper side of the housing, and a second cavity open toward the upper side of the housing. The first cavity and the second cavity connect in this case by a connecting channel. An optoelectronic semiconductor chip is arranged in the first cavity. A potting material is arranged in a region of the first cavity enclosing the optoelectronic semiconductor chip.

The second cavity of the housing of this optoelectronic component advantageously forms a reservoir for the potting material. The fill level of the potting material in the first cavity results in dependence on the quantity of the potting material. Since the volumes of the first cavity and the second cavity are connected to one another via the connecting channel in the housing of this optoelectronic component, the fill level of the potting material in the first cavity results in dependence on the quantity of the potting material in the total volume formed by the first cavity and the second cavity. Since the total volume of the first cavity and the second cavity and of the connecting channel of the housing, which connects the first cavity and the second cavity, is greater than the volume of the first cavity alone, a variation of the quantity of the potting material introduced into the total volume causes a lesser variation of the fill level of the potting material in the first cavity than would be the case with a total volume which only comprises the volume of the first cavity. This advantageously enables the fill level of the potting material in the first cavity of the housing of the optoelectronic component to be specified with greater accuracy and reproducibility in spite of unavoidable tolerances in the dimensioning of the quantity of the potting material arranged in the first cavity.

A further advantage of the housing, which has the first cavity and the second cavity, of the optoelectronic component is that the potting material can be decanted into the second cavity and can reach the first cavity therefrom. Unintentional and undesired contamination of a radiation-emitting upper side of the optoelectronic semiconductor chip or an upper side of an element arranged above the optoelectronic semiconductor chip can thus be avoided during the decanting of the potting material.

The connecting channel may have a lesser width perpendicular to a connecting direction between the first cavity and the second cavity than the first cavity and the second cavity. The first cavity and the second cavity are thus advantageously formed as volumes clearly separated from one another. This enables the contour of the first cavity of the housing of the optoelectronic component to be designed so that the optoelectronic semiconductor chip arranged in the first cavity is surrounded on all sides closely and with approximately constant spacing from the walls of the first cavity. In this way, it is advantageously ensured that only small menisci form on the surface of the potting material on all sides adjacent to the optoelectronic semiconductor chip. Reliable embedding of the optoelectronic semiconductor chip and reliable covering of bond wires by the potting material are thus advantageously assisted. A further advantage of the first cavity, which is clearly delimited from the second cavity, is that the second cavity can be cut off in a subsequent processing step to reduce a size of the housing.

The first cavity may have a first volume and the second cavity may have a second volume. In this case, the second volume is at least as large as the first volume. A significant enlargement of the total volume formed by the volumes of first cavity and second cavity in relation to the first volume is then advantageously achieved by the second cavity. The second cavity of the housing of the optoelectronic component thus forms an effective reservoir for the potting material and can effectively compensate for filling quantity variations of the potting material.

A bond wire may be arranged between an electrical contact surface of the optoelectronic semiconductor chip and a bond surface of the housing. The bond wire can advantageously be covered in this case by the potting material and thus be protected from damage by external mechanical effects. This advantageously increases the robustness of the optoelectronic component.

The bond surface may be arranged in the connecting channel. No space thus advantageously has to be reserved for the bond surface in the first cavity of the housing of the optoelectronic component. This enables the contour of the first cavity of the housing of the optoelectronic component to be formed so that the optoelectronic semiconductor chip arranged in the first cavity is surrounded on all sides closely and with approximately uniform spacing from the walls of the first cavity. A meniscus of the potting material arranged in the first cavity is thus advantageously formed with approximately equal size on all sides of the optoelectronic semiconductor chip. This assists reliable embedding of the optoelectronic semiconductor chip and reliable and complete covering of the bond wire by the potting material.

The optoelectronic semiconductor chip may have an upper side having a first geometric shape. In this case, the first cavity has a bottom surface having a geometric basic shape which can be formed by stretching from the first geometric shape. In addition, the bottom surface of the first cavity additionally has a bulge in relation to the geometric basic shape. The bond surface is arranged in the bulge on the bottom surface in this case. The walls of the first cavity advantageously surround the optoelectronic semiconductor chip arranged in the first cavity on all sides of the optoelectronic semiconductor chip with approximately equal spacing due to the similarity of the first geometric shape of the upper side of the optoelectronic semiconductor chip and the geometric basic shape of the bottom surface of the first cavity. The shape of the first cavity only deviates from the shape of the optoelectronic semiconductor chip in the region of the bulge. Since the bulge is only provided to accommodate the bond wire, the bulge can be formed with lesser size. Due to the approximately equal spacing between the outer edges of the optoelectronic semiconductor chip and the walls of the first cavity on all sides of the optoelectronic semiconductor chip, the potting material arranged in the first cavity forms menisci of approximately equal size on all sides of the optoelectronic semiconductor chip. Reliable embedding of the optoelectronic semiconductor chip and reliable covering of the bond wire by the potting material are thus ensured. The arrangement of the bond surface on the bottom surface in the bulge of the first cavity advantageously enables a part of the housing of the optoelectronic component, which comprises the second cavity and, if desired, also the connecting channel between first cavity and second cavity, to be cut off to reduce the overall size of the housing of the optoelectronic component.

A potting material may be arranged in the second cavity. The second cavity of the housing of the optoelectronic component advantageously forms a reservoir in this case for the potting material and thus equalizes filling quantity variations of the potting material.

The potting material, in the direction perpendicular to the upper side of the housing, may have different heights in the first cavity and in the second cavity. This advantageously enables the reservoir formed by the second cavity of the housing of the optoelectronic component to compensate for filling quantity variations of the potting material. In this case, the level of the potting material in the first cavity results substantially independently of variations of the quantity of the potting material. Reliable embedding of the optoelectronic semiconductor chip and reliable covering of the bond wire are thus advantageously ensured. Contamination of an upper side of the optoelectronic semiconductor chip or an upper side of an element arranged on the optoelectronic semiconductor chip by potting material are also reliably prevented at the same time.

The first cavity may be delimited by a circumferential wall having a step. In this case, the first cavity widens the upper side of the housing at the step toward. By providing the step, a desired fill level of the potting material in the first cavity can advantageously be predefined. With sufficiently small spacing between the wall of the first cavity and the optoelectronic semiconductor chip arranged in the first cavity, the wall of the first cavity is wetted by the potting material up to the step due to capillary effects. The potting material arranged in the first cavity thus reliably has a predefined setpoint value independently of possible filling quantity variations of the potting material.

The first cavity and the second cavity may have different depths in the direction perpendicular to the upper side of the housing. The volume of the second cavity can thus advantageously be enlarged in relation to the volume of the first cavity.

The optoelectronic semiconductor chip may have a radiation-emitting upper side. In this case, a wavelength-converting element is arranged on the radiation-emitting upper side. The wavelength-converting element can be designed to convert a wavelength of electromagnetic radiation emitted by the optoelectronic semiconductor chip. The wavelength-converting element can have, for example, an embedded phosphor for this purpose.

There may be a height difference of less than 60 μm between an upper side of the wavelength-converting element and a circumferential edge, which is formed on the housing, of the first cavity in the direction perpendicular to the upper side of the housing. Reliable embedding of the optoelectronic semiconductor chip and the wavelength-converting element in the potting material arranged in the first cavity can thus advantageously be ensured, without an upper side of the wavelength-converting element being contaminated by the potting material.

There may be a height difference of less than 60 μm between an upper side of the optoelectronic semiconductor chip and a circumferential edge, which is formed on the housing, of the first cavity in the direction perpendicular to the upper side of the housing. Reliable embedding of the optoelectronic semiconductor chip in the potting material arranged in the first cavity of the housing of the optoelectronic component is thus advantageously ensured, without the upper side of the optoelectronic semiconductor chip being contaminated by the potting material.

The housing may have a further cavity open toward the upper side of the housing. In this case, the further cavity connects by a further connecting channel to the first cavity or to the second cavity. The further cavity can advantageously be used as a further reservoir for the potting material arranged in the first cavity and can thus further increase the total volume of the first cavity, the second cavity, the further cavity, and the connecting channels. A further optoelectronic semiconductor chip can also be arranged in the further cavity.

A further optoelectronic semiconductor chip may be arranged in the further cavity. The first cavity and the further cavity can advantageously simultaneously be filled with potting material in this optoelectronic component. The potting material can advantageously be decanted into the second cavity of the housing of the optoelectronic component and can reach the first cavity and the further cavity through the connecting channel and the further connecting channel. Contamination of an upper side of the optoelectronic semiconductor chip or an upper side of an element arranged on the optoelectronic semiconductor chip and contamination of an upper side of the further optoelectronic semiconductor chip or an upper side of an element arranged on the further optoelectronic semiconductor chip by the potting material can thus reliably be prevented during the decanting of the potting material.

A method of producing an optoelectronic component comprises steps of providing a housing having a first cavity open toward an upper side of the housing, and a second cavity open toward the upper side of the housing, wherein the first cavity and the second cavity connect by a connecting channel, to arrange an optoelectronic semiconductor chip in the first cavity, and introducing a potting material into a region of the first cavity enclosing the optoelectronic semiconductor chip. This method advantageously enables reliable and reproducible setting of a fill level of the potting material in the first cavity. The fill level of the potting material in the first cavity achieved in the method is advantageously tolerant in this case in relation to variations of the filling quantity of the potting material. This is achieved in that the second cavity and the connecting channel are used as a reservoir for the potting material. The volume enlargement achieved by the second cavity and the connecting channel reduces the dependence of the achieved fill level of the potting material in the first cavity on the filling quantity of the potting material. The method thus advantageously enables reliable embedding of the optoelectronic semiconductor chip. At the same time, there is advantageously only a small risk of contamination of an upper side of the optoelectronic semiconductor chip or an upper side of an element arranged on the upper side of the optoelectronic semiconductor chip in the method.

The potting material may be introduced into the second cavity. In this case, the potting material reaches the first cavity from the second cavity through the connecting channel. Contamination of an upper side of the optoelectronic semiconductor chip or an upper side of an element arranged on the upper side of the optoelectronic semiconductor chip by the potting material, for example, contamination by sprays, is thus advantageously prevented during the introduction of the potting material.

The method may comprise a further step of cutting off a part of the housing comprising the second cavity. The cutting off of the part of the housing comprising the second cavity can be performed, for example, after curing the potting material. The size of the remaining part of the housing of the optoelectronic component is advantageously reduced by cutting off the part of the housing comprising the second cavity. The optoelectronic component obtainable by the method thus advantageously has compact external dimensions.

The above-described properties, features and advantages and the manner in which they are achieved will be more clearly and unambiguously comprehensible in conjunction with the following description of the examples explained in greater detail in conjunction with the drawings.

Figure 2:
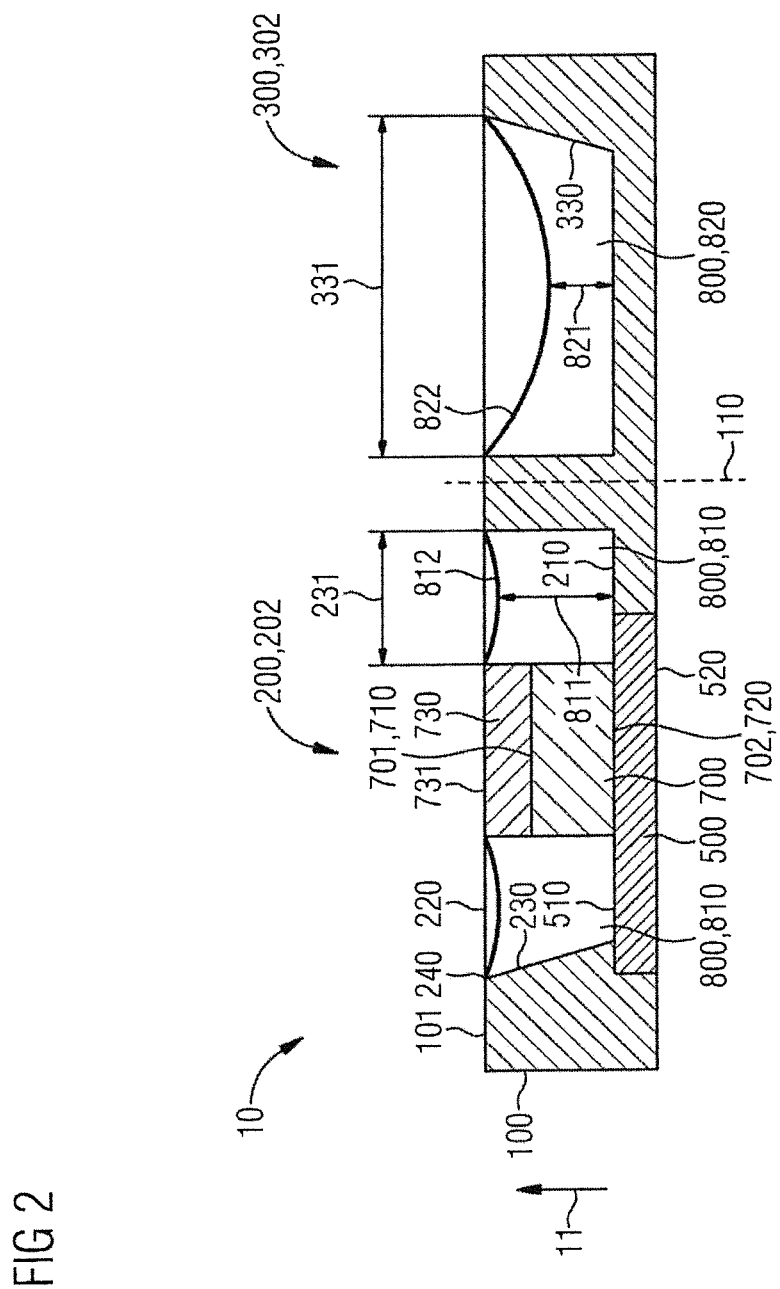
FIG. 2 shows a section through the first optoelectronic component.

FIG. 1 shows a schematic illustration of a top view of an upper side 101 of a housing 100 of a first optoelectronic component 10. FIG. 2 shows the housing 100 of the first optoelectronic component 10 in an illustration in section along a section line I-I shown in FIG. 1. The first optoelectronic component 10 can be a light-emitting diode component, for example.

The housing 100 comprises an electrically insulating material, for example, a plastic material. The housing 100 can be produced, for example, by injection molding, transfer molding or by another molding process.

The housing 100 of the first optoelectronic component 10 has a first cavity 200. The first cavity 200 is open toward the upper side 101 of the housing 100. The first cavity 200 therefore extends from the upper side 101 of the housing 100 into the housing 100. At the upper side 101 of the housing 100, the first cavity 200 has an opening area 220. A bottom of the first cavity 200 is arranged inside the housing 100 and formed by a bottom surface 210. A circumferential wall 230 is formed by the material of the housing 100, laterally delimits the first cavity 200 and extends between the bottom surface 210 and the opening area 220 of the first cavity 200. The circumferential wall 230 forms an edge 240 at the opening area 220. The edge 240 therefore bounds the opening area 220 of the first cavity 200.

The housing 100 has a second cavity 300 in addition to the first cavity 200. The second cavity 300 is also open toward the upper side 101 of the housing 100. The second cavity 300 therefore also extends from the upper side 101 of the housing 100 into the housing 100. The second cavity 300 also has a bottom surface arranged inside the housing 100. The second cavity 300 has an opening area at the upper side 101 of the housing 100. A circumferential wall 330 of the second cavity 300 is formed by the material of the housing 100, laterally delimits the second cavity 300, and extends between the bottom surface and the opening area of the second cavity 300.

The first cavity 200 and the second cavity 300 of the housing 100 of the first optoelectronic component 10 connect to one another by a connecting channel 400. The connecting channel 400 is also open toward the upper side 101 of the housing 100, and thus extends from the upper side 101 of the housing 100 into the housing 100.

The connecting channel 400 extends along a connecting direction between the first cavity 200 and the second cavity 300. The connecting channel has a width 401 perpendicular to this connecting direction and in parallel to the upper side 101 of the housing 100. The first cavity 200 has a width 201 in the same direction. The second cavity 300 has a width 301 in the same direction. The width 401 of the connecting channel 400 is less than the width 201 of the first cavity 200 and less than the width 301 of the second cavity 300. This means that the coherent volume of the first cavity 200, the connecting channel 400, and the second cavity 300 widens from the connecting channel 400 toward the first cavity 200 and toward the second cavity 300. The connecting channel 400 forms a constriction between the first cavity 200 and the second cavity 300.

An optoelectronic semiconductor chip 700 is arranged in the first cavity 200 of the housing 100 of the first optoelectronic component 10. The optoelectronic semiconductor chip 700 can be a light-emitting diode chip (LED chip), for example. The optoelectronic semiconductor chip 700 emits electromagnetic radiation, for example, visible light. The optoelectronic semiconductor chip 700 can be designed, for example, as a surface-emitting light-emitting diode chip or as a volume-emitting light-emitting diode chip.

The optoelectronic semiconductor chip 700 has an upper side 701 and a lower side 702 opposite the upper side 701. The optoelectronic semiconductor chip 700 is arranged in the first cavity 200 such that the lower side 702 of the optoelectronic semiconductor chip 700 faces toward the bottom surface 210 of the first cavity 200. The upper side 701 of the optoelectronic semiconductor chip 700 is oriented toward the opening of the first cavity 200 on the upper side 101 of the housing 100.

In the example shown in FIGS. 1 and 2, a wavelength-converting element 730 is arranged on the upper side 701 of the optoelectronic semiconductor chip 700. The wavelength-converting element 730 is provided to convert a wavelength of electromagnetic radiation emitted by the optoelectronic semiconductor chip 700. For this purpose, the wavelength-converting element 730 can absorb electromagnetic radiation having a first wavelength and emit electromagnetic radiation having a second, typically greater wavelength. The wavelength-converting element 730 can comprise, for example, an embedded phosphor. The embedded phosphor can be an organic phosphor or an inorganic phosphor in this case. The embedded phosphor can comprise quantum dots.

The wavelength-converting element 730 has an upper side 731 facing away from the upper side 701 of the optoelectronic semiconductor chip 700. The upper side 731 of the wavelength-converting element 730 therefore forms an upper side of an optoelectronic semiconductor chip arrangement formed by the optoelectronic semiconductor chip 700 and the wavelength-converting element 730. However, the wavelength-converting element 730 can also be omitted. In this case, the upper side 701 of the optoelectronic semiconductor chip 700 forms the upper side of the optoelectronic semiconductor chip arrangement. A further element, for example, a clear ceramic, a glass or a transparent potting material can also be arranged on the upper side 701 of the optoelectronic semiconductor chip 700 or on the upper side 731 of the wavelength-converting element 730. In this case, an upper side of the further element would form an upper side of the optoelectronic semiconductor chip arrangement. The upper side 731 of the wavelength-converting element 730 represents the upper side of the optoelectronic semiconductor chip arrangement hereafter.

The upper side 701 of the optoelectronic semiconductor chip 700 has a first geometric shape. In the illustrated example, the upper side 701 of the optoelectronic semiconductor chip 700 has a rectangular shape. The first geometric shape of the upper side 701 of the optoelectronic semiconductor chip 700 can also be different from rectangular, however. The bottom surface 210 of the first cavity 200 of the housing 100 has a geometric basic shape which can be formed by stretching from the first geometric shape of the upper side 701 of the optoelectronic semiconductor chip 700. The geometric basic shape of the bottom surface 210 is thus similar to the first geometric shape of the upper side 701 of the optoelectronic semiconductor chip 700, but larger than the latter. In the illustrated example, the bottom surface 210 of the first cavity 200 has a rectangular geometric basic shape.

The shape of the bottom surface 210 of the first cavity 200 of the housing 100 of the first optoelectronic component 10 thus deviates from the geometric basic shape, however, in that the first cavity 200 has an additional bulge 250. In the region of the bulge 250, the bottom surface 210 extends beyond the geometric basic shape. In the illustrated example, the bulge 250 is rectangular and arranged on an outer edge of the rectangular geometric basic shape of the bottom surface 210 of the first cavity 200. In this case, the bulge 250 adjoins in the illustrated example at a corner region of the rectangular geometric basic shape of the bottom surface 210 of the first cavity 200. However, the bulge 250 can also be arranged at another position of the first cavity 200. The bulge 250 is small in relation to the remaining dimensions of the first cavity 200. For example, the volume of the bulge 250 can make up less than 10% of the total volume of the first cavity 200.

The opening area 220 of the first cavity 200 also preferably has a geometric basic shape similar to the first geometric shape of the upper side 701 of the optoelectronic semiconductor chip 700. In this case, the opening area 220 of the first cavity 200 only deviates in the area of the bulge 250 from the geometric basic shape.

A first conductor frame section 500 and a second conductor frame section 600 are embedded in the housing 100 of the first optoelectronic component 10. The first conductor frame section 500 and the second conductor frame section 600 each comprise an electrically conductive material, for example, a metal. The first conductor frame section 500 and the second conductor frame section 600 can be manufactured, for example, from stamping and/or etching, from a shared workpiece. The first conductor frame section 500 and the second conductor frame section 600 are spaced apart from one another and electrically insulated from one another.

The first conductor frame section 500 has a chip receptacle surface 510 and a first solder contact surface 520 opposite the chip receptacle surface 510. The second conductor frame section 600 has a bond surface 610 and a second solder contact surface 620 opposite the bond surface 610. The first conductor frame section 500 and the second conductor frame section 600 are embedded in the material of the housing 100 such that the chip receptacle surface 510 and the first solder contact surface 520 of the first conductor frame section 500 and also the bond surface 610 and the second solder contact surface 620 of the second conductor frame section 600 are each at least partially not covered by the material of the housing 100. The first solder contact surface 520 of the first conductor frame section 500 and the second solder contact surface 620 of the second conductor frame section 600 are accessible on a rear side of the housing 100 opposite the upper side 101 of the housing 100. The chip receptacle surface 510 of the first conductor frame section 500 and the bond surface 610 of the second conductor frame section 600 are accessible on the bottom surface 210 of the first cavity 200 and form a part of the bottom surface 210 of the first cavity 200. The chip receptacle surface 510 of the first conductor frame section 500 is arranged in the part of the bottom surface 210 of the first cavity 200 forming the geometric basic shape. The bond surface 610 of the second conductor frame section 600 is arranged in the part of the bottom surface 210 of the first cavity 200 forming the bulge 250.

The optoelectronic semiconductor chip 700 has an upper electrical contact surface 710 on its upper side 701. On its lower side 702, the optoelectronic semiconductor chip 700 has a lower electrical contact surface 720. An electrical voltage can be applied to the optoelectronic semiconductor chip 700 between the upper electrical contact surface 710 and the lower electrical contact surface 720, to cause the optoelectronic semiconductor chip 700 to emit electromagnetic radiation.

The upper electrical contact surface 710 is arranged in a corner region of the upper side 701 of the optoelectronic semiconductor chip 700. The wavelength-converting element 730 is arranged above the upper side 701 of the optoelectronic semiconductor chip 700 and has an opening 740 in the region of the upper electrical contact surface 710 of the optoelectronic semiconductor chip 700. The upper electrical contact surface 710 of the optoelectronic semiconductor chip 700 is thus exposed in spite of the wavelength-converting element 730 arranged on the upper side 701 of the optoelectronic semiconductor chip 700.

The optoelectronic semiconductor chip 700 is arranged on the bottom surface 210 of the first cavity 200 such that the lower electrical contact surface 720 of the optoelectronic semiconductor chip 700 has an electrically conductive connection to the chip receptacle surface 510 of the first conductor frame section 500. The lower side 702 of the optoelectronic semiconductor chip 700 can be connected, for example, by solder or a conductive adhesive to the chip receptacle surface 510 of the first conductor frame section 500.

A bond wire 630 is arranged between the upper electrical contact surface 710 on the upper side 701 of the optoelectronic semiconductor chip 700 and the bond surface 610 of the second conductor frame section 600. The bond wire 630 establishes an electrically conductive connection between the upper electrical contact surface 710 of the optoelectronic semiconductor chip 700 and the bond surface 610 of the second conductor frame section 600. The bond wire 630 is arranged in this case inside the first cavity 200 and extends at least partially into the bulge 250 of the first cavity 200.

The first solder contact surface 520 of the first conductor frame section 500 electrically conductively connects via the chip receptacle surface 510 to the lower electrical contact surface 720 of the optoelectronic semiconductor chip 700. The second solder contact surface 620 of the second conductor frame section 600 electrically conductively connects to the upper electrical contact surface 710 of the optoelectronic semiconductor chip 700 via the bond surface 610 and the bond wire 630. The first solder contact surface 520 and the second solder contact surface 620 form externally accessible electrical terminal surfaces of the first optoelectronic component 10. The first solder contact surface 520 and the second solder contact surface 620 can be electrically contacted, for example, according to a method of surface mounting. The first optoelectronic component 10 then forms an SMD component. For example, the first solder contact surface 520 and the second solder contact surface 620 can be electrically contacted by reflow soldering.

A potting material 800 is arranged in a region, which encloses the optoelectronic semiconductor chip 700, of the first cavity 200 of the housing 100 of the first optoelectronic component 10. The potting material 800 is also arranged in the second cavity 300 of the housing 100 and in the connecting channel 400 of the housing 100. A first part 810 of the potting material 800 is arranged in the region of the first cavity 200 enclosing the optoelectronic semiconductor chip 700. A second part 820 of the potting material 800 is arranged in the second cavity 300. A third part 830 of the potting material 800 is arranged in the connecting channel 400.

The potting material 800 can comprise, for example, silicone or an epoxy resin or a hybrid material having silicone and epoxy resin. The potting material 800 can be essentially transparent to electromagnetic radiation, in particular to electromagnetic radiation emitted by the optoelectronic semiconductor chip 700 and/or the wavelength-converting element 730. The potting material 800 can also be pigmented, however. For example, the potting material 800 can comprise embedded scattering particles. The scattering particles can comprise $TiO_2$, for example. The potting material 800 can also comprise an embedded wavelength-converting phosphor.

The first part 810 of the potting material 800 is arranged in the region of the first cavity 200 enclosing the optoelectronic semiconductor chip 700 and encloses the lateral surfaces of the optoelectronic semiconductor chip 700 and the wavelength-converting element 730, preferably as completely as possible, but does not cover the upper side of the optoelectronic semiconductor chip arrangement having the optoelectronic semiconductor chip 700. In the example shown in FIGS. 1 and 2, the first part 810 of the potting material 800 thus does not cover the upper side 731 of the wavelength-converting element 730. If the optoelectronic semiconductor chip 700 did not have the wavelength-converting element 730, the upper side 701 of the optoelectronic semiconductor chip 700 would thus not be covered by the potting material 800.

The bond wire 630 is preferably completely embedded in the first part 810 of the potting material 800 and thus protected from damage by external mechanical effects.

In a direction 11 perpendicular to the upper side 101 of the housing 100, there is preferably a height difference of less than 60 μm between the upper side 731 of the wavelength-converting element 730 and the edge 240 of the opening area 220 formed on the upper side 101 of the housing 100. If the wavelength-converting element 730 were not present, in the direction 11 perpendicular to the upper side 101 of the housing 100, there is accordingly a height difference of preferably less than 60 μm between the upper side 701 of the optoelectronic semiconductor chip 700 or an upper side of another element arranged on the upper side 701 of the optoelectronic semiconductor chip 700 and the edge 240 of the first cavity 200. In this way, the first part 810 of the potting material 800 can essentially completely cover the circumferential wall 230 of the first cavity 200 and also the lateral surfaces of the optoelectronic semiconductor chip 700 and the wavelength-converting element 730, without the first part 810 of the potting material 800 reaching the upper side 731 of the wavelength-converting element 730.

The optoelectronic semiconductor chip 700 is preferably arranged approximately centrally in the part of the first cavity 200 having the geometric basic shape. The outer edges of the upper side 731 of the wavelength-converting element 730 thus have an essentially constant spacing 231 to the edge 240 of the circumferential wall 230 of the first cavity 200 almost everywhere. The spacing 231 is dimensioned in this case as the shortest spacing between the outer edge of the upper side 731 of the wavelength-converting element 730 and the edge 240 of the circumferential wall 230 of the first cavity 200. The outer edge of the upper side 731 of the wavelength-converting element 730 and the edge 240 of the opening area 220 of the first cavity 200 only have a greater distance from one another in the direction parallel to the upper side 101 of the housing 100 in the region of the connecting channel 400 and in the region of the bulge 500.

On its free surface arranged close to the upper side 101 of the housing 100, the potting material 800 forms menisci, the shape of which is essentially determined by a surface tension of the potting material 800. Gravitational effects only play a subordinate role in this case. A first meniscus 812 forms between the edge of the upper side 731 of the wavelength-converting element 730 and the circumferential wall 230 of the first cavity 200. A second meniscus 822 forms in the second cavity 300 between opposing sections of the circumferential wall 330 of the second cavity 300.

The radii of the menisci 812, 822 are approximately equal because of the approximately constant hydrostatic pressure within the potting material 800. However, sections of the circumferential wall 330 of the second cavity 300 opposite one another have a wall spacing 331 substantially greater than the spacing 231 between the outer edges of the upper side 731 of the wavelength-converting element 730 and the circumferential wall 230 of the first cavity 200. As a result, the first part 810 of the potting material 800 arranged in the first cavity 200 has a first height 811 calculated from the bottom surface 210 of the first cavity 200 to the lowest point of the first meniscus 812 of the first part 810 of the potting material 800 greater than a second height 821 calculated from the bottom region of the second cavity 300 to the lowest point of the second meniscus 822 of the second part 820 of the potting material 800.

Since the spacing between the upper side 731 of the wavelength-converting element 730 and the circumferential wall 230 of the first cavity 200 in the direction parallel to the upper side 101 of the housing 100 is small almost all around the wavelength-converting element 730, the contour of the edge 240 of the opening area 220 of the first cavity 200 is thus oriented to the first geometric shape of the upper side 731 of the wavelength-converting element 730, the first part 810 of the potting material 800 arranged in the first cavity 200 has the first height 811, which only differs by a small amount from the height of the optoelectronic semiconductor chip arrangement and the height of the first cavity 200. It is thus ensured that a part of the bond wire 630 extending inside the part of the first cavity 200 having the geometric basic shape is completely covered by the first part 810 of the potting material 800 arranged in the first cavity 200.

Since parts of the circumferential wall 230 of the first cavity 200 opposite one another only have a small spacing from one another in the region of the bulge 250 of the first cavity 200, preferably a spacing approximately corresponding to the spacing 231 between the upper side 731 of the wavelength-converting element 730 and the circumferential wall 230 of the first cavity 200, the first part 810 of the potting material 800 also has a height in the region of the bulge 250 of the first cavity 200 approximately corresponding to the first height 811. It is thus advantageously ensured that a part of the bond wire 630 extending in the region of the bulge 250 is also completely covered by the potting material 800.

The spacing 231 between the outer edges of the upper side 731 of the wavelength-converting element 730 and the circumferential wall 230 of the first cavity 200 in the direction parallel to the upper side 101 of the housing 100, and also the spacing between opposing sections of the circumferential wall 230 in the region of the bulge 250 of the first cavity 200 are preferably less than 600 µm. In this case, a smaller spacing 231 is preferred. The spacing 231 is particularly preferably 100 µm to 300 µm.

The potting material 800 is preferably decanted in free-flowing form into the second cavity 300 of the housing 100 of the first optoelectronic component 10 during the production of the first optoelectronic component 10 and reaches the first cavity 200 therefrom via the connecting channel 400. The potting material 800 subsequently hardens. By decanting the potting material 800 into the second cavity 300, a risk is advantageously reduced that the upper side 731 of the wavelength-converting element 730 will be unintentionally contaminated with potting material 800 by spray during the decanting of the potting material 800.

The second cavity 300 and also, to a lesser extent, the connecting channel 400 are used as reservoirs for the potting material 800, by which the filling quantity variations of the potting material 800 are balanced. The first cavity 200 has a first volume 202. The second cavity 300 has a second volume 302. The second volume 302 is preferably of similar size to the first volume 202 or larger. Since the total volume formed from the first volume 202 of the first cavity 200 and the second volume 302 of the second cavity 300 and also the volume of the connecting channel 400 is large, a variation of the filling quantity of the potting material 800 decanted into the cavities 200, 300 only causes a slight variation of the first height 811 of the first part 810 of the potting material 800 in the first cavity 200.

Because of the small spacing 231 between the optoelectronic semiconductor chip 700 or the wavelength-converting element 730 and the circumferential wall 230 of the first cavity 200, potting material 800 arriving via the connecting channel 400 from the second cavity 300 in the first cavity 200 causes a capillary force having the result that the first part 810 of the potting material 800 arriving in the first cavity 200 essentially completely wets the lateral surfaces of the optoelectronic semiconductor chip 700 and the wavelength-converting element 730 and also the circumferential wall 230 of the first cavity 200. This complete wetting is also assisted by the small height difference between the upper side 731 of the wavelength-converting element 730 and the upper side 101 of the housing 100.

The complete covering of the lateral surfaces of the optoelectronic semiconductor chip 700 and the wavelength-converting element 730 and of the circumferential wall 230 of the first cavity 200 is independent, within a tolerance range, of the filling quantity of the potting material 800 introduced into the cavities 200, 300 and the connecting channel 400. A variation of the filling quantity of the potting material 800 only results, within the tolerance range, in a variation of the second height 821 of the second part 820 of the potting material 800 in the second cavity 300, but only to a very limited extent in a variation of the first height 811 of the first part 810 of the potting material 800 in the first cavity 200.

The circumferential wall 230 of the first cavity 200 can be oriented perpendicularly to the upper side 101 of the housing 100. In this case, the first cavity 200 has a cylindrical shape. However, the circumferential wall 230 can also enclose an angle other than a right angle with the upper side 101 of the housing 100. In this case, the first cavity 200 widens from the bottom surface 210 toward the opening area 220 or tapers from the bottom surface 210 toward the opening area 220. The first cavity 200 is then designed in the form of a truncated cone. Individual sections of the circumferential wall 230 can also be arranged perpendicularly to the upper side 101 of the housing 100 and other sections of the circumferential wall 230 can be arranged at a different angle with respect to the upper side 101 of the housing 100. The second cavity 300 can also be designed as cylindrical, in the form of a truncated cone, or in another manner.

After curing the potting material 800 introduced into the cavities 200, 300 and the connecting channel 400, a part of the housing 100 comprising the second cavity 300 can be cut off to reduce the size of the housing 100 of the first optoelectronic component 10. For example, the housing 100 can be split along a partition plane 110, which is schematically shown in FIGS. 1 and 2, and which extends through the connecting channel 400 between the first cavity 200 and the second cavity 300. The part of the housing 100 comprising the second cavity 300 is no longer required after the curing of the potting material 800.

Further optoelectronic components will be explained hereafter on the basis of FIGS. 3 to 10. The further optoelectronic components each have large correspondences with the first optoelectronic component 10 of FIGS. 1 and 2. Components of the further optoelectronic components corresponding to components present in the first optoelectronic component 10 are identified in FIGS. 3 to 10 with the reference signs also used in FIGS. 1 and 2 and are not described in detail again hereafter. Only the differences between the first optoelectronic component 10 and the further optoelectronic components are described hereafter.

Figure 3:
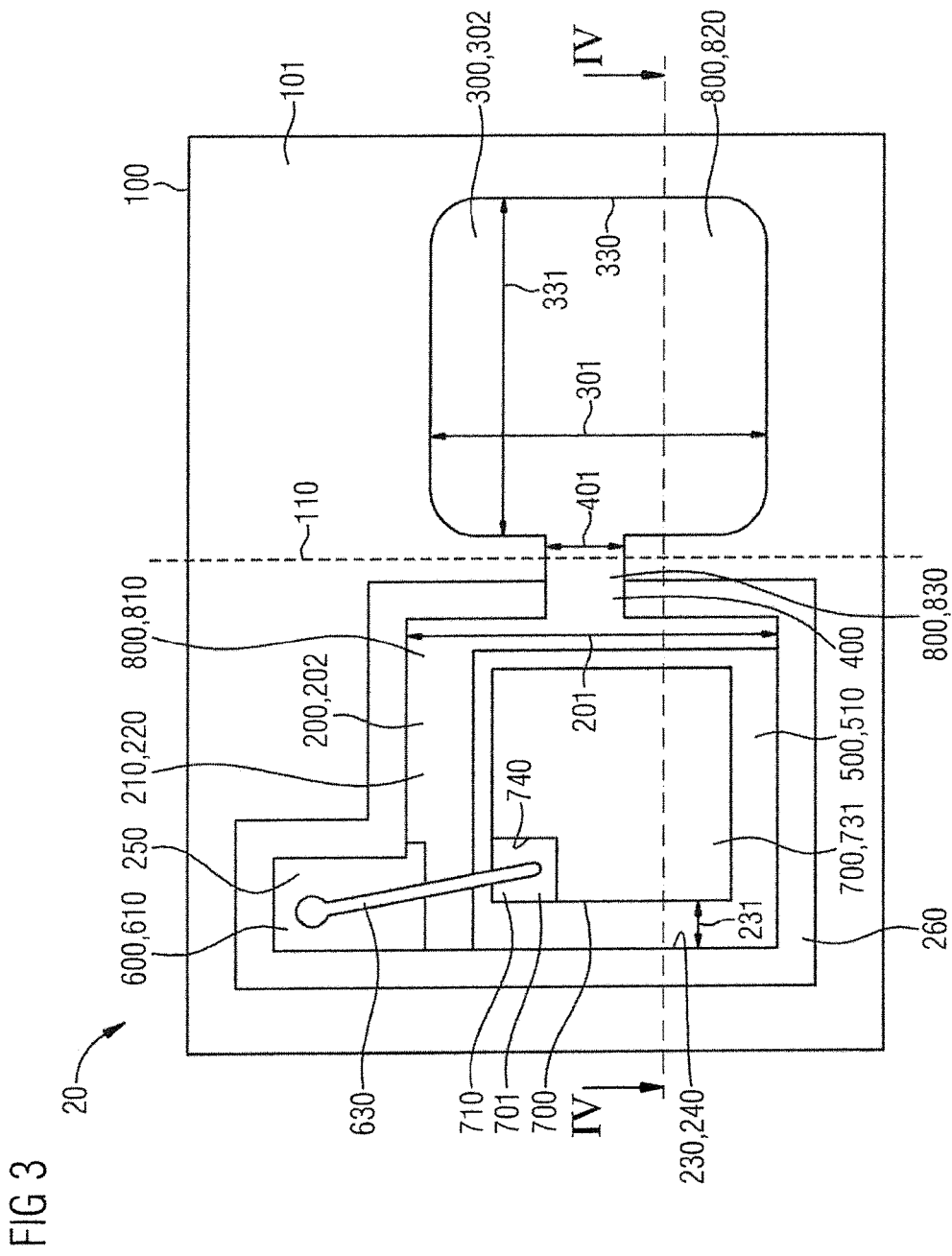
FIG. 3 shows a top view of a second optoelectronic component.
Figure 4:
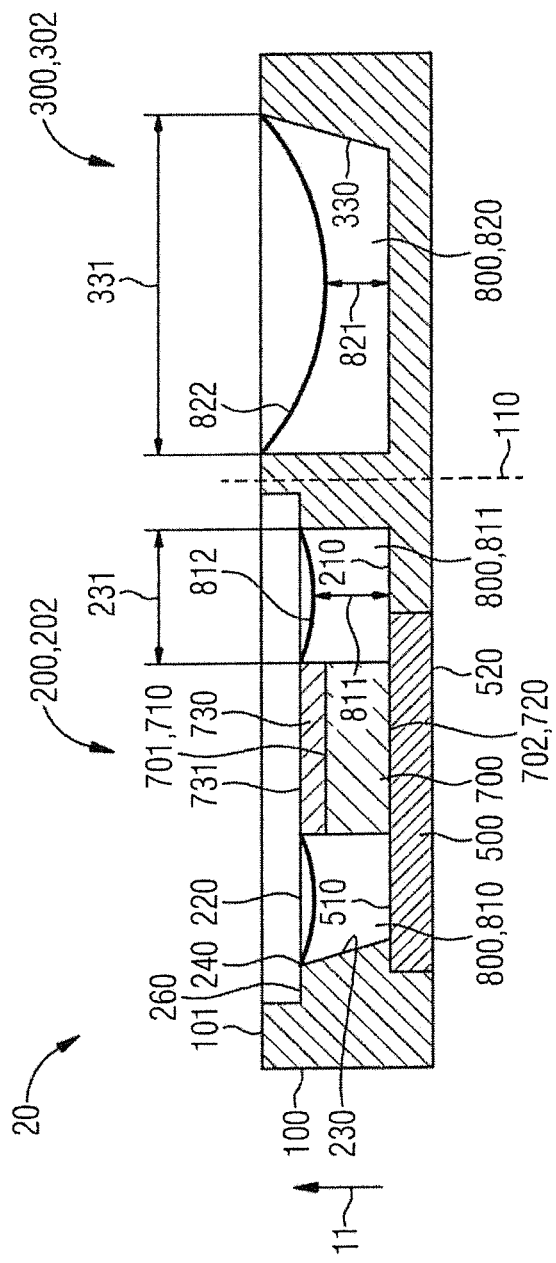
FIG. 4 shows a section through the second optoelectronic component.

FIG. 3 shows a schematic top view of a second optoelectronic component 20. FIG. 4 shows a schematic side view of an illustration in section along section line IV-IV, which is indicated in FIG. 3, of the second optoelectronic component 20.

The second optoelectronic component 20 differs from the first optoelectronic component 10 in that the circumferential wall 230 of the first cavity 200 of the housing 100 of the second optoelectronic component 20 has a step 260, at which the first cavity 200 widens toward the upper side 101 of the housing 100. In this case, the height of the first cavity 200 in the direction 11 perpendicular to the upper side 101 of the housing 100 and between the bottom surface 210 and the step 260 is adapted to the height of the optoelectronic semiconductor chip arrangement. There is therefore preferably a height difference of less than 60 µm between the upper side 731 of the wavelength-converting element 730 and the step 260 in the perpendicular direction 11.

The first part 810 of the potting material 800 arranged in the first cavity 200 extends from the bottom surface 210 of the first cavity 200 up to the height of the step 260 in the circumferential wall 230 of the first cavity 200 and in this case preferably essentially completely covers the outer surfaces of the optoelectronic semiconductor chip 700 and the wavelength-converting element 730 and also the circumferential wall 230 up to the height of the step 260.

The circumferential wall 330 of the second cavity 300 of the housing 100 of the second optoelectronic component 20 does not have a step. The second volume 302 of the second cavity 300 is thus increased once again in relation to the first volume 202 of the first cavity 200 in the second optoelectronic component 20 in comparison to the first optoelectronic component 10. The second cavity 300 can thus accommodate a larger quantity of the potting material 800 compared to the first cavity 200 in the second optoelectronic component 20 and thus forms a still more effective reservoir for the potting material 800. In this way, still greater filling quantity variations of the potting material 800 can be equalized in the second optoelectronic component than in the first optoelectronic component 10.

In a further variant (not shown in the figures) of the first optoelectronic component 10, the volume of the second cavity 300 is increased in relation to the volume of the first cavity 200 in that the second cavity 300 is formed deeper than the first cavity 200. In the direction 11 perpendicular to the upper side 101 of the housing 100, the bottom surface of the second cavity 300 can be arranged lower in this case than the bottom surface 210 of the first cavity 200.

Figure 5:
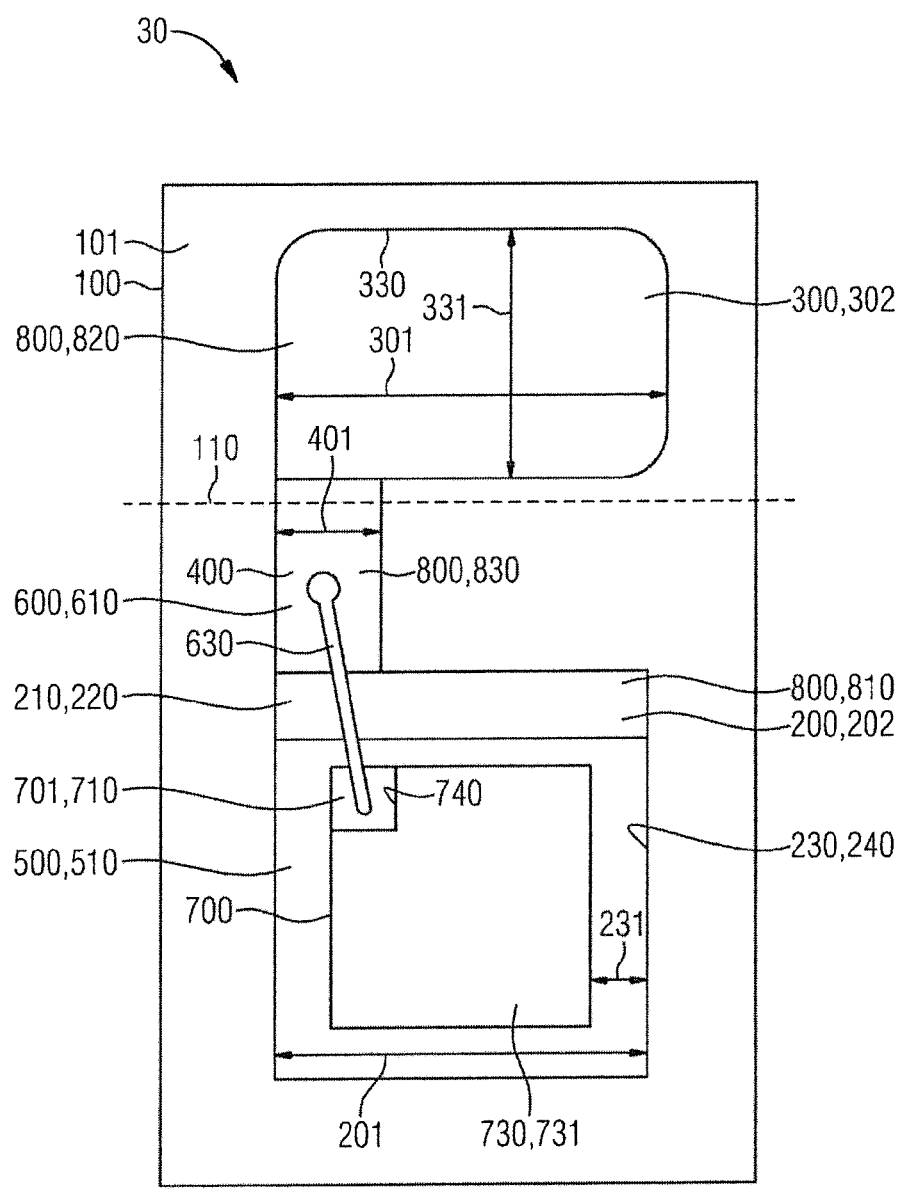
FIG. 5 shows a top view of a third optoelectronic component.

FIG. 5 shows a schematic top view of a third optoelectronic component 30. In the third optoelectronic component 30, the first cavity 200 of the housing 100 does not have a bulge 250. Therefore, the shape of the bottom surface 210 of the first cavity 200 in the third optoelectronic component 30 completely corresponds to the geometric basic shape, which can be formed by stretching from the first geometric shape of the upper side 701 of the optoelectronic semiconductor chip 700. In this way, the contour of the edge 240 of the opening area 220 of the first cavity 200 in the third optoelectronic component 30 advantageously follows the edge of the upper side 731 of the wavelength-converting element 730 with particularly high accuracy.

The bond surface 610 of the second conductor frame section 600 is arranged in the region of the connecting channel 400 in the third optoelectronic component 30. The bond wire 630 extends from the upper electrical contact surface 710 of the optoelectronic semiconductor chip 700 to the bond surface 610 of the second conductor frame section 600 and extends partially in this case in the first cavity 200 and partially in the connecting channel 400.

Because of the tight enclosure of the contour of the optoelectronic semiconductor chip arrangement by the circumferential wall 230 of the first cavity 200 and the large first height 811 resulting therefrom of the first part 810 of the potting material 800 arranged in the first cavity 200, the part of the bond wire 630 extending in the first cavity 200 is completely covered by the potting material 800. Because of the small width 401 of the connecting channel 400, which preferably approximately corresponds to the spacing 231 between the edge of the wavelength-converting element 730 and the circumferential wall 230 of the first cavity 200, a high fill level of the potting material 800 also results in the region of the connecting channel 400, whereby the part of the bond wire 630 extending in the connecting channel 400 is also completely covered by the potting material 800 and thus protected from damage by external mechanical effects.

In the third optoelectronic component 30, after the curing of the potting material 800, a part of the housing 100 comprising the second cavity 300 can also be cut off, for example, along the partition plane 100, which is schematically indicated in FIG. 5.

Figure 6:
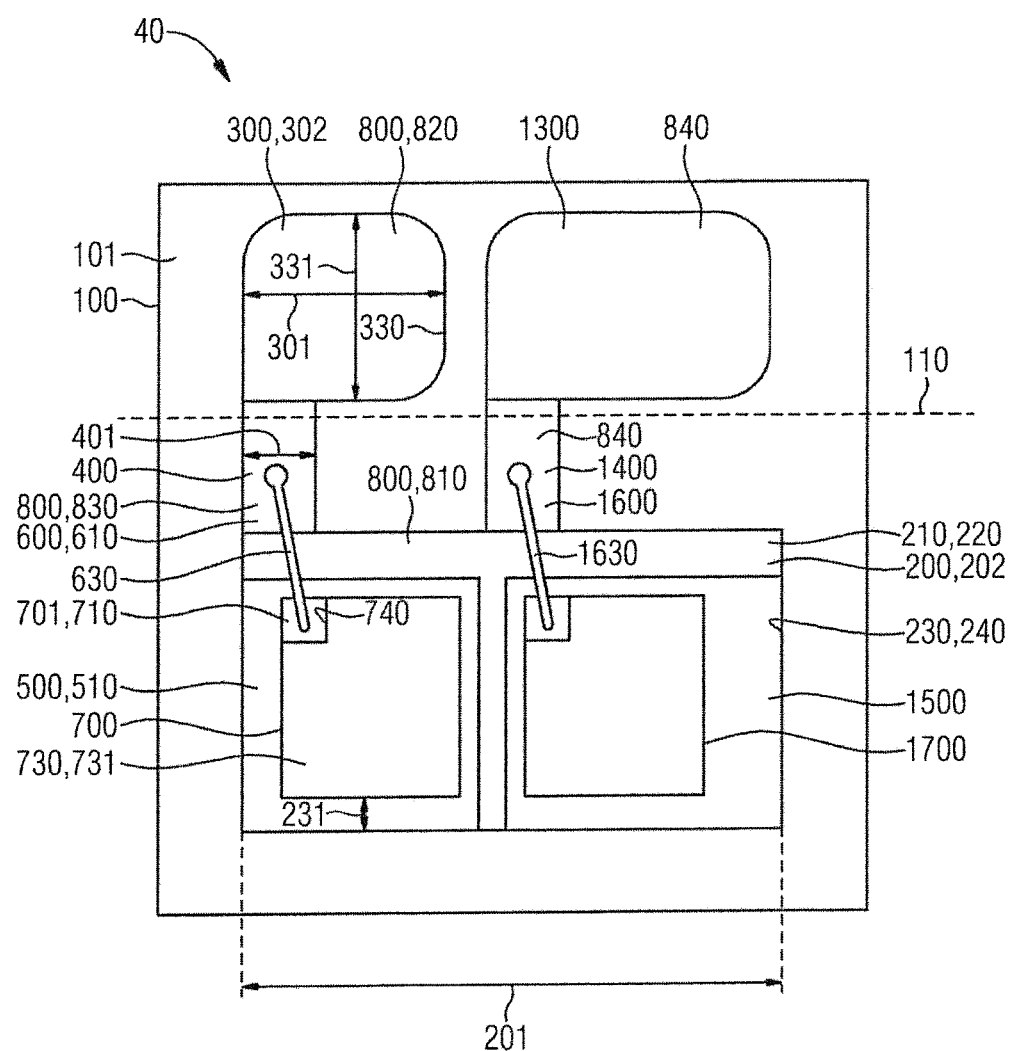
FIG. 6 shows a top view of a fourth optoelectronic component.

FIG. 6 shows a schematic top view of a fourth optoelectronic component 40. In the fourth optoelectronic component 40, the housing 100 has, in addition to the first cavity 200 and the second cavity 300, still a further second cavity 1300. The further second cavity 1300 connects via a further connecting channel 1400 to the first cavity 200.

In the fourth optoelectronic component 40, a further optoelectronic semiconductor chip 1700 is arranged in the first cavity 200 in addition to the optoelectronic semiconductor chip 700. The further optoelectronic semiconductor chip 1700 can be designed like the optoelectronic semiconductor chip 700 and can also have a wavelength-converting element or another element on its top side. The further optoelectronic semiconductor chip 1700 can be designed to emit electromagnetic radiation, the wavelength of which corresponds to the wavelength of the electromagnetic radiation emitted by the optoelectronic semiconductor chip 700. The further optoelectronic semiconductor chip 1700 can also be provided for emitting electromagnetic radiation having a different wavelength, however.

The first cavity 200 of the housing 100 of the fourth optoelectronic component 40 does not have a bulge 250.

A further first conductor frame section 1500 and a further second conductor frame section 1600 are embedded in the housing 100 of the fourth optoelectronic component 40 in addition to the first conductor frame section 500 and the second conductor frame section 600. The further first conductor frame section 1500 has a further chip receptacle surface and a further first solder contact surface. The further second conductor frame section 1600 has a further bond surface and a further second solder contact surface. The chip receptacle surface 510 of the first conductor frame section 500 and the further chip receptacle surface of the further first conductor frame section 1500 are arranged in the region of the bottom surface 210 of the first cavity 200. The bond surface 610 of the second conductor frame section 600 is arranged in the region of the connecting channel 400. The further bottom surface of the further second conductor frame section 1600 is arranged in the region of the further connecting channel 1400.

The first optoelectronic semiconductor chip 700 is arranged on the chip receptacle surface 510 of the first conductor frame section 500 and connected by the bond wire 630 to the bond surface 610 of the second conductor frame section 600. The bond wire 630 extends partially in this case through the first cavity 200 and partially through the connecting channel 400. The further optoelectronic semiconductor chip 1700 is arranged on the further chip receptacle surface of the further first conductor frame section 1500 and connects by a further bond wire 1630 to the further bond surface of the further second conductor frame section 1600. The further bond wire 1630 extends partially in this case through the first cavity 200 and partially through the further connecting channel 1400.

It is also possible to form the first conductor frame section 500 and the further first conductor frame section 1500 in one piece as a shared first conductor frame section. Alternatively or additionally, the second conductor frame section 600 and the further second conductor frame section 1600 can accordingly be formed in one piece as a shared second conductor frame section. In this case, the optoelectronic semiconductor chip 700 and the further optoelectronic semiconductor chip 1700 electrically connect in parallel between the shared first conductor frame section and the shared second conductor frame section. In the case of separately formed first conductor frame sections 500, 1500 and/or second conductor frame sections 600, 1600, in contrast, the optoelectronic semiconductor chip 700 and the further optoelectronic semiconductor chip 1700 can be separately activated via the first solder contact surface, the further first solder contact surface, the second solder contact surface, and the further second solder contact surface.

In the housing 100 of the fourth optoelectronic component 40, potting material 800 can be decanted via the second cavity 300 and/or the further second cavity 1300 and reaches the first cavity 200 and optionally the second cavity 300 or the further second cavity 1300 via the connecting channel and the further connecting channel 1400. A further part 840 of the potting material 800 remains in this case in the further second cavity 1300.

After the curing of the potting material 800, a part of the housing 100 comprising the second cavity 300 and the further second cavity 1300 can be cut off, for example, along the partition plane 110 indicated in FIG. 6.

Figure 7:
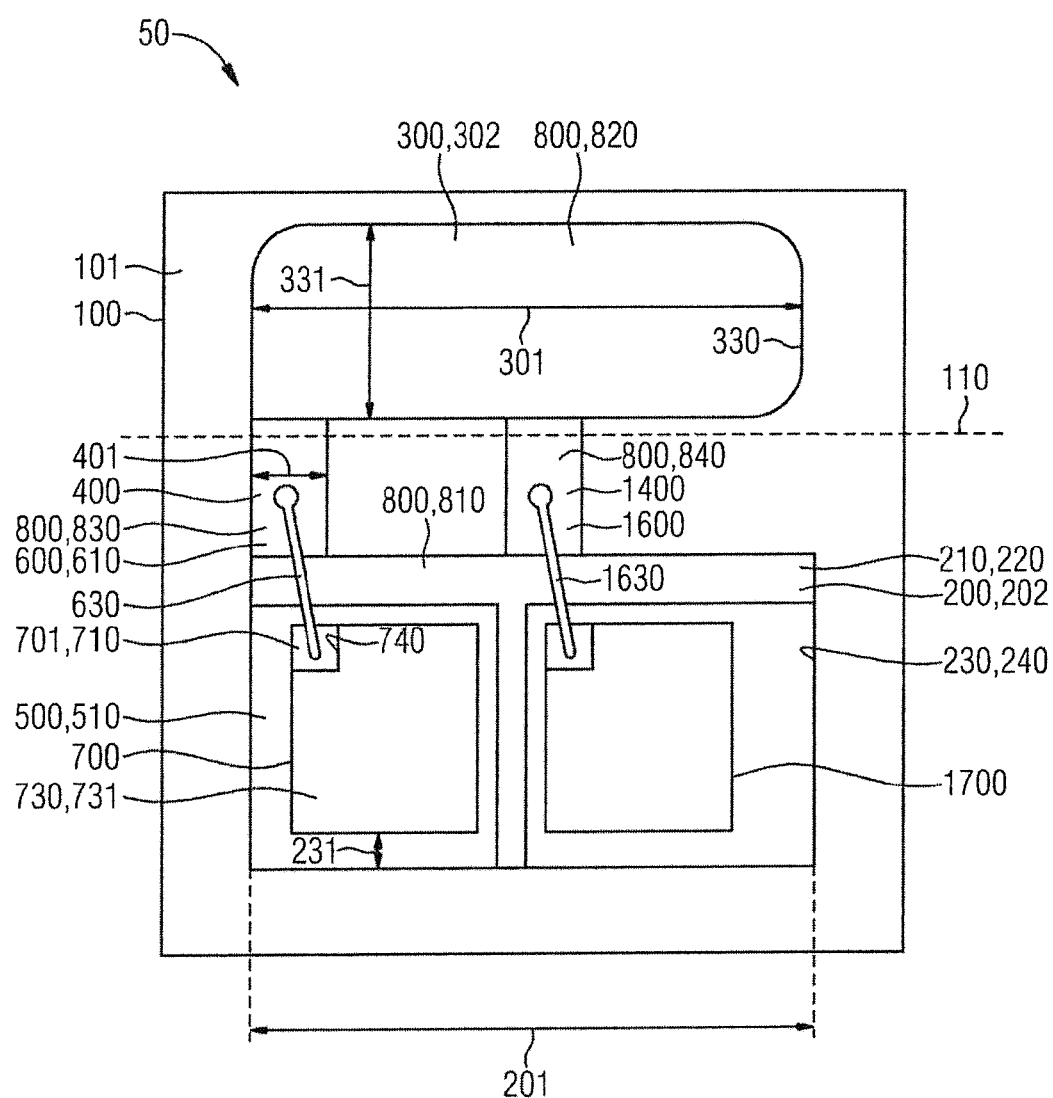
FIG. 7 shows a top view of a fifth optoelectronic component.

FIG. 7 shows a schematic top view of a fifth optoelectronic component 50. The fifth optoelectronic component 50 has large correspondences with the fourth optoelectronic component 40 of FIG. 6. However, no further second cavity 1300 is provided in the fifth optoelectronic component 50. Therefor, the first cavity 200 in the fifth optoelectronic component 50 is not only connected via the connecting channel 400 to the second cavity 300, but rather additionally also via the further connecting channel 1400.

The connecting channel 400 is used in the fifth optoelectronic component 50 for accommodating a part of the bond wire 630. The further connecting channel 1400 is used in the fifth optoelectronic component 50 to accommodate a part of the further bond wire 1630.

The potting material 800 can be decanted in the housing 100 of the fifth optoelectronic component 50 into the second cavity 300 and can reach the first cavity 200 therefrom via the connecting channel 400 and the further connecting channel 1400. In the connecting channel 400, the potting material 800 remaining therein covers the part of the bond wire 630 arranged in the connecting channel 400. In the further connecting channel 1400, the potting material 800 remaining in the further connecting channel 1400 covers the part of the further bond wire 1630 arranged in the further connecting channel 1400.

Figure 8:
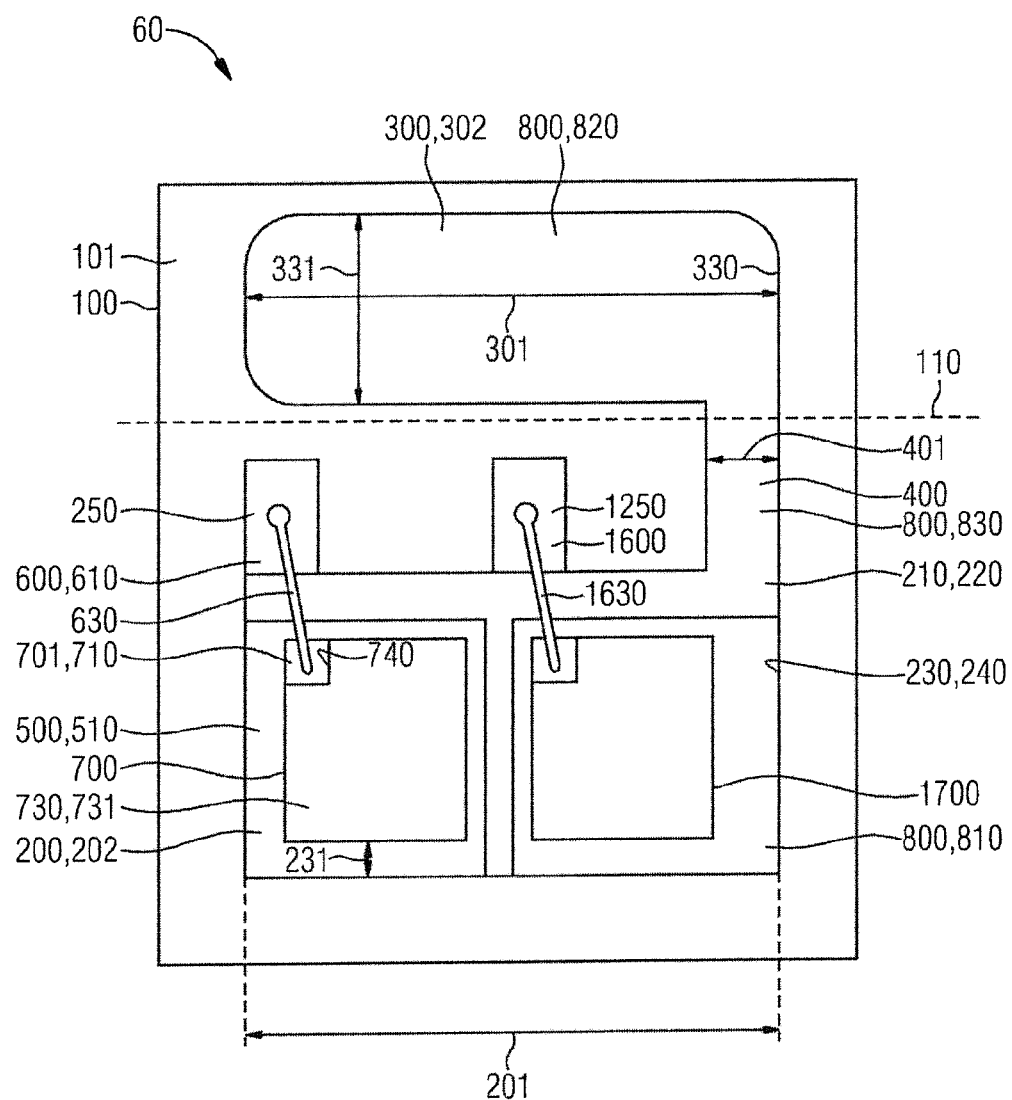
FIG. 8 shows a top view of a sixth optoelectronic component.

FIG. 8 shows a schematic top view of a sixth optoelectronic component 60. In the housing 100 of the sixth optoelectronic component 60, the first cavity 200 connects via the connecting channel 400 to the second cavity 300. The first cavity 200 has, in addition to the bulge 250, a further bulge 1250. In the sixth optoelectronic component 60, the shape of the bottom surface 210 therefore differs from the geometric basic shape obtainable by stretching from the first geometric shape of the upper side 701 of the optoelectronic semiconductor chip 700 both in the region of the bulge 250 and also in the region of the further bulge 1250.

The sixth optoelectronic component 60 again has, in addition to the first conductor frame section 500 and the second conductor frame section 600, a further first conductor frame section 1500 and a further second conductor frame section 1600. The further first conductor frame section 1500 is, like the first conductor frame section 500, arranged in the region of the geometric basic shape of the first cavity 200. The second conductor frame section 600 is arranged in the region of the bulge 250 of the first cavity 200. The further second conductor frame section 1600 is arranged in the region of the further bulge 1250. The optoelectronic semiconductor chip 700 is arranged on the chip receptacle surface 510 of the first conductor frame section 500 and connects by the bond wire 630 to the bond surface 610 of the second conductor frame section 600. A further optoelectronic semiconductor chip 1700 is arranged on the chip receptacle surface of the further first conductor frame section 1500 and connects by a further bond wire 1630 to the bond surface of the further second conductor frame section 1600.

Figure 9:
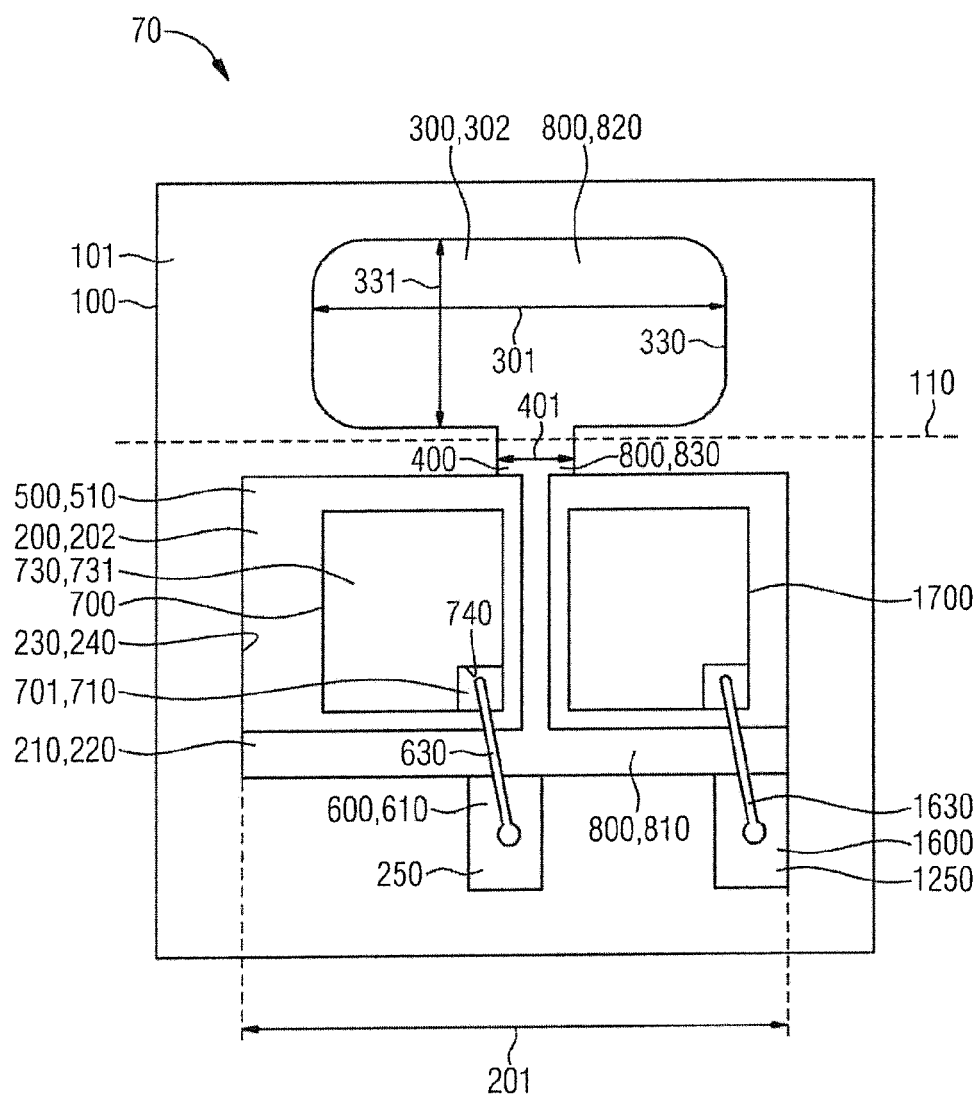
FIG. 9 shows a top view of a seventh optoelectronic component.

FIG. 9 shows a schematic top view of a seventh optoelectronic component 70. The seventh optoelectronic component 70 essentially corresponds to the sixth optoelectronic component 60. However, the bulge 250 and the further bulge 1250 are arranged in the seventh optoelectronic component 70 on a side of the first cavity 200 facing away from the second cavity 300, while the bulge 250 and the further bulge 1250 in the sixth optoelectronic component 60 of FIG. 8 are arranged on a side of the first cavity 200 facing toward the second cavity 300. The arrangement illustrated in FIG. 9 enables the connecting channel 400 between the first cavity 200 and the second cavity 300 to be formed shorter in the seventh optoelectronic component 70 of FIG. 9 than in the sixth optoelectronic component 60 of FIG. 8.

Figure 10:
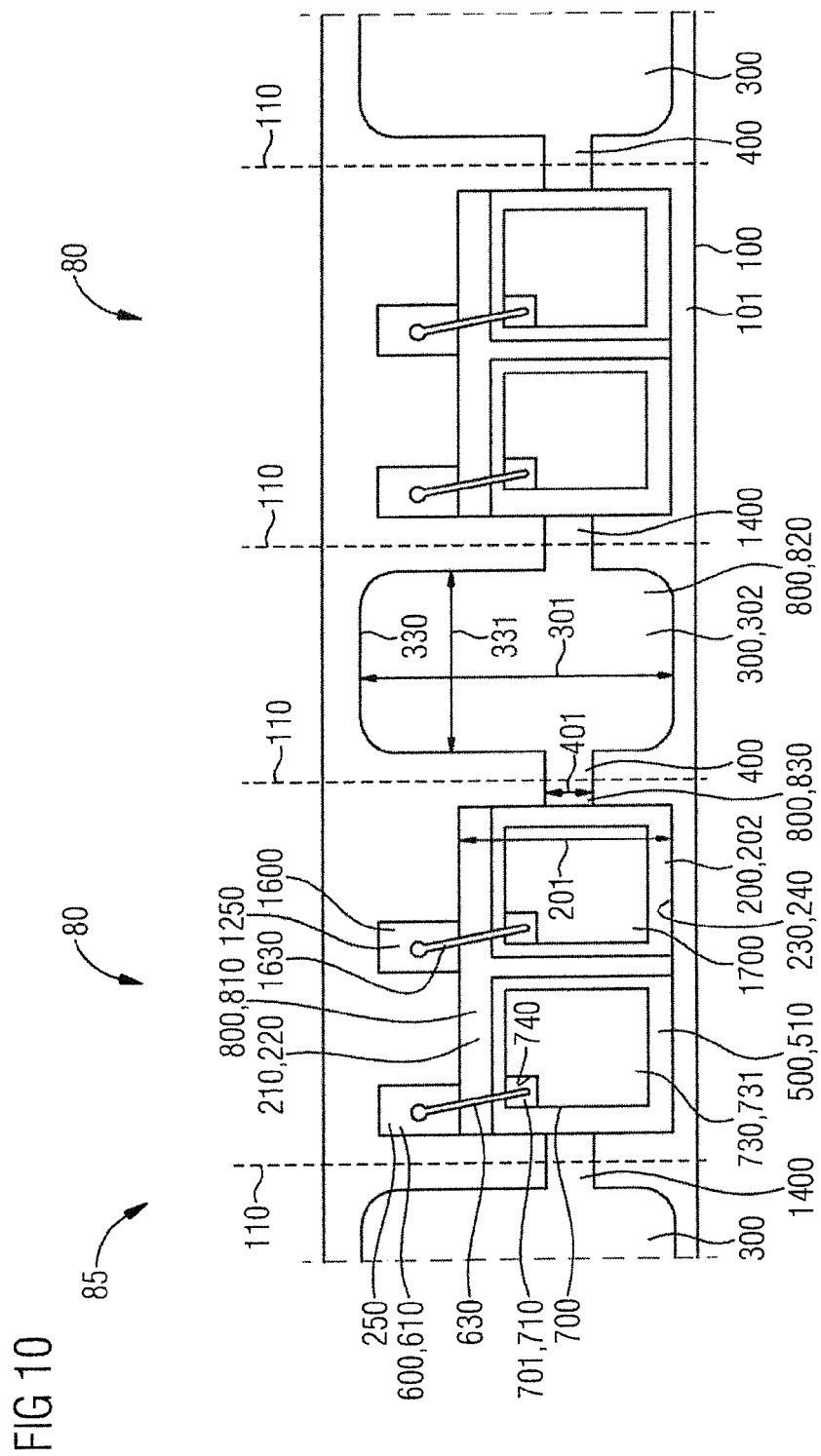
FIG. 10 shows a top view of a component composite having a plurality of eighth optoelectronic components.

FIG. 10 shows a schematic top view of a component composite 85 having a plurality of eighth optoelectronic components 80. The eighth optoelectronic components 80 of the component composite 85 were produced in common work steps and can be split along the partition planes 110 in a processing step chronologically following the illustration of FIG. 10.

In each eighth optoelectronic component 80, the first cavity 200 has the bulge 250 and a further bulge 1250. In this case, the first cavity 200 connects via the connecting channel 400 to the second cavity 300. Still a further optoelectronic semiconductor chip 1700 is arranged in addition to the optoelectronic semiconductor chip 700 in the first cavity 200. In this regard, the eighth optoelectronic components 80 correspond to the sixth optoelectronic components 60 of FIG. 8 and the seventh optoelectronic components 70 of FIG. 9.

In addition, however, in the component composite 85, the second cavity 300 of each eighth optoelectronic component 80 connects via a further connecting channel 1400 to the first cavity 200 of a respective adjacent eighth optoelectronic component 80. During production of the eighth optoelectronic components 80 of the component composite 85, the potting material 800 is decanted into the second cavities 300 of the eighth optoelectronic components 80 and can reach the first cavity 200 of the same eighth optoelectronic component 80 in each case via the connecting channel 400 and can reach the first cavity 200 of the adjacent eighth optoelectronic component 80 in each case via the further connecting channel 1400. Due to the large coherent volume of the first cavities 200 and second cavities 300 of all eighth optoelectronic components 80 of the component composite 85, a tolerance which is substantially larger still results in relation to filling quantity variations of the introduced potting material 800.

After curing the potting material 800, the eighth optoelectronic components 80 of the component composite 85 can be separated from one another. In addition, in each case the parts of the housing 100 comprising the second cavities 300 of the eighth optoelectronic components 80 can be cut off The optoelectronic components 10, 20, 30, 40, 50, 60, 70 of FIGS. 1 to 9 can also be produced as component composites in accordance with the illustration of FIG. 10. The remaining features of the optoelectronic components 10, 20, 30, 40, 50, 60, 70, 80 may also be combined with one another arbitrarily.

Our components and methods are illustrated and described in greater detail on the basis of the preferred examples. Nonetheless, this disclosure is not restricted to the disclosed examples. Rather, other variations can be derived therefrom by those skilled in the art, without leaving the scope of protection of the appended claims.

The invention claimed is:

1. An optoelectronic component comprising a housing having a first cavity open toward an upper side of the housing, and a second cavity open toward the upper side of the housing,
   wherein the first cavity and the second cavity connect by a connecting channel,
   an optoelectronic semiconductor chip is arranged in the first cavity,
   a potting material is arranged in a region of the first cavity enclosing the optoelectronic semiconductor chip,
   a bond wire is arranged between an electrical contact surface of the optoelectronic semiconductor chip and a bond surface of the housing,
   the bond surface is arranged in the connecting channel,
   the housing has a further cavity open toward the upper side of the housing, and
   the further cavity connects by a further connecting channel to the first cavity or to the second cavity.

2. The optoelectronic component as claimed in claim 1, wherein the connecting channel has a lesser width perpendicular to a connecting direction between the first cavity and the second cavity than the first cavity and the second cavity.

3. The optoelectronic component as claimed in claim 1, wherein the first cavity has a first volume,
   the second cavity has a second volume, and
   the second volume is at least as large as the first volume.

4. The optoelectronic component as claimed in claim 1, wherein a potting material is arranged in the second cavity.

5. The optoelectronic component as claimed in claim 4, wherein the potting material in the direction perpendicular to the upper side of the housing has different heights in the first cavity and in the second cavity.

6. The optoelectronic component as claimed in claim 1, wherein the first cavity is delimited by a circumferential wall,
   the wall has a step, and
   the first cavity widens toward the upper side of the housing at the step.

7. The optoelectronic component as claimed in claim 1, wherein the first cavity and the second cavity have different depths in the direction perpendicular to the upper side of the housing.

8. The optoelectronic component as claimed in claim 1, wherein the optoelectronic semiconductor chip has a radiation-emitting upper side, and
   a wavelength-converting element is arranged on the radiation-emitting upper side.

9. The optoelectronic component as claimed in claim 8, wherein there is a height difference of less than 60 μm between an upper side of the wavelength-converting element and a circumferential edge formed on the housing, of the first cavity in the direction perpendicular to the upper side of the housing.

10. The optoelectronic component as claimed in claim 1, wherein there is a height difference of less than 60 μm between an upper side of the optoelectronic semiconductor chip and a circumferential edge formed on the housing of the first cavity in the direction perpendicular to the upper side of the housing.

11. The optoelectronic component as claimed in claim 1, wherein a further optoelectronic semiconductor chip is arranged in the further cavity.

12. An optoelectronic component comprising a housing having a first cavity open toward an upper side of the housing, and a second cavity open toward the upper side of the housing,
   wherein the first cavity and the second cavity connect by a connecting channel,
   an optoelectronic semiconductor chip is arranged in the first cavity,
   a potting material is arranged in a region of the first cavity enclosing the optoelectronic semiconductor chip,
   a bond wire is arranged between an electrical contact surface of the optoelectronic semiconductor chip and a bond surface of the housing,
   the optoelectronic semiconductor chip has an upper side having a first geometric shape,
   the first cavity has a bottom surface having a geometric basic shape formed by stretching from the first geometric shape,
   the bottom surface of the first cavity additionally has a bulge in relation to the geometric basic shape,
   the bond surface is arranged in the bulge on the bottom surface,
   the housing has a further cavity open toward the upper side of the housing, and
   the further cavity connects by a further connecting channel to the first cavity or to the second cavity.

13. The optoelectronic component as claimed in claim 12, wherein a potting material is arranged in the second cavity.

14. The optoelectronic component as claimed in claim 13, wherein the potting material, in the direction perpendicular to the upper side of the housing, has different heights in the first cavity and in the second cavity.

15. The optoelectronic component as claimed in claim 12, wherein the first cavity and the second cavity have different depths in the direction perpendicular to the upper side of the housing.

* * * * *